(12) United States Patent
Zhao et al.

(10) Patent No.: US 10,700,218 B2
(45) Date of Patent: Jun. 30, 2020

(54) HIGH-VOLTAGE ALUMINUM NITRIDE (AlN) SCHOTTKY-BARRIER DIODES

(71) Applicant: ARIZONA BOARD OF REGENTS ON BEHALF OF ARIZONA STATE UNIVERSITY, Scottsdale, AZ (US)

(72) Inventors: Yuji Zhao, Chandler, AZ (US); Houqiang Fu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/178,146

(22) Filed: Nov. 1, 2018

(65) Prior Publication Data

US 2019/0140110 A1    May 9, 2019

Related U.S. Application Data

(60) Provisional application No. 62/582,600, filed on Nov. 7, 2017.

(51) Int. Cl.
*H01L 29/20* (2006.01)
*H01L 29/872* (2006.01)
(Continued)

(52) U.S. Cl.
CPC ........ *H01L 29/872* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 21/02576* (2013.01); *H01L 29/0615* (2013.01); *H01L 29/2003* (2013.01); *H01L 29/205* (2013.01); *H01L 29/402* (2013.01); *H01L 29/66143* (2013.01); *H01L 29/66212* (2013.01); *H01L 29/452* (2013.01); *H01L 29/475* (2013.01)

(58) Field of Classification Search
CPC ............... H01L 29/2003; H01L 29/205; H01L 29/66212
See application file for complete search history.

(56) References Cited

U.S. PATENT DOCUMENTS

2016/0268130 A1* 9/2016 Sugiyama ......... H01L 21/02381

OTHER PUBLICATIONS

Baca, A. et al, "An AlN/Al 0.85 Ga 0.15 N high electron mobility transistor", Appl. Phys. Lett., vol. 109, No. 3, pp. 033509, Jul. 2016.
(Continued)

*Primary Examiner* — Thomas L Dickey
(74) *Attorney, Agent, or Firm* — Fish & Richardson P.C.

(57) ABSTRACT

An AlN Schottky barrier diode device on sapphire substrates is formed using metal organic chemical vapor deposition and demonstrates a kV-level breakdown voltage. The device structure employs a thin n-AlN epilayer as the device active region and thick resistive AlN underlayer as the insulator. At room temperature, the device was characterized by a low turn-on voltage of 1.2 V, a high on/off ratio of ~$10^5$, a low ideality factor of 5.5, and a low reverse leakage current below 1 nA. Due to the ultra-wide bandgap of AlN, the device also exhibited excellent thermal stability over 500 K representing, therefore, a cost-effective route to high performance AlN based Schottky barrier diodes for high power, high voltage and high temperature applications.

13 Claims, 7 Drawing Sheets

(51) Int. Cl.
| | |
|---|---|
| *H01L 29/205* | (2006.01) |
| *H01L 29/40* | (2006.01) |
| *H01L 21/02* | (2006.01) |
| *H01L 29/66* | (2006.01) |
| *H01L 29/06* | (2006.01) |
| *H01L 29/45* | (2006.01) |
| *H01L 29/47* | (2006.01) |

(56) References Cited

OTHER PUBLICATIONS

Chen, H. et al, "Optical properties of highly polarized InGaN light-emitting diodes modified by plasmonic metallic grating", Opt. Exp., vol. 24, No. 10, pp. A856-A867, Apr. 2016.

Chu, R., et al, "1200-V normally Off GaN-on-Si field-effect transistors with low dynamic on -resistance", IEEE Electron Device Lett., vol. 32, No. 5, pp. 632-634, May 2011.

Dutta, M., et al, "Demonstration of diamond-based Schottky p-i-n diode with blocking voltage > 500 V", IEEE Electron Device Lett., vol. 37, No. 9, pp. 1170-1173, Sep. 2016.

Dutta, M., et al, "High voltage diodes in diamond using (100) and (111) substrates", IEEE Electron Device Lett., vol. 38, No. 5, pp. 600-603, May 2017.

Fontserè, A., et al, "Temperature dependence of Al/Ti-based Ohmic contact to GaN devices: HEMT and MOSFET", Microelectron. Eng., vol. 88, No. 10, pp. 3140-3144, Oct. 2011.

Fu, H. et al, "Theoretical analysis of modulation doping effects on intersubband transition properties of semipolar AlGaN/GaN quantum well", J. Appl. Phys., vol. 121, No. 1, pp. 014501, Jan. 2017.

Fu, H., et al, "Analysis of low efficiency droop of semipolar InGaN quantum well light-emitting diodes by modified rate equation with weak phase-space filling effect", AIP Adv., vol. 6, No. 6, pp. 065013, Jun. 2016.

Fu, H., et al, "Crystal orientation dependent intersubband transition in semipolar AlGaN/GaN single quantum well for optoelectronic applications", J. Appl. Phys., vol. 119, No. 17, pp. 174502, May 2016.

Fu, H., et al, "Effect of buffer layer design on vertical GaN-on-GaN p-n and Schottky power diodes", IEEE Electron Device Lett., vol. 38, No. 6, pp. 763-766, Apr. 2017.

Fu, H., et al, "Study of low efficiency droop in semipolar (20-2-1) InGaN light-emitting diodes by time-resolved ohotoluminescence", J. Display Technol., vol. 12, No. 7, pp. 736-741, Jul. 2016.

Huang, X. et al, "Analysis of loss mechanisms in InGaN solar cells using a semi-analytical model", J. Appl. Phys., vol. 119, No. 21, pp. 213101, Jun. 2016.

Irokawa, Y., et al, "Shottky Barrier Diodes on AlN Free-Standing Substrates", Jpn. J. Appl. Phys., vol. 51, No. 4R, pp. 040206, Mar. 2012.

Islam, S.M., et al, "MBE-grown 232-270 nm deep-UV LEDs using monolayer thin binary GaN/AlN quantum heterostructures", Appl. Phys. Lett., vol. 110, No. 4, Jan. 2017.

Iucolano, F. et al, "Barrier inhomogeneity and electrical properties of Pt/GaN Schottky contacts", J. Appl. Phys., vol. 102, No. 11, pp. 113701, Dec. 2007.

Kinoshita, T. et al, "Fabrication of vertical Schottky barrier diodes on n-type freestanding AlN substrates grown by hydride vapor phase epitaxy", Appl. Phys. Exp., vol. 8, No. 6, pp. 061003, May 2015.

Kinoshita, T. et al, "Performance and reliability of deep-ultraviolet light-emitting diodes fabricated on AlN substrates prepared by hydride vapor phase epitaxy", Appl. Phys. Exp., vol. 6, No. 9, pp. 092103, Aug. 2013.

Kizilyalli, I.C., et al, "4-kV and 2.8-m Omega-cm 2 vertical GaN p-n diodes with low leakage currents", IEEE Electron Device Lett., vol. 36, No. 10, pp. 1073-1075, Oct. 2015.

Knauer, A. et al, "Correlation of sapphire off-cut and reduction of defect density in MOVPE grown AlN", Phys. Status Solidi B, vol. 253, No. 5, pp. 809-814, Mar. 2016.

Li, G., et al, "Two-dimensional electron gases in strained quantum wells for AlN/GaN/AlN double heterostructure field-effect transistors on AlN", Appl. Phys. Lett., vol. 104, No. 19, pp. 193506, May 2014.

Li, G., et al, "Ultrathin body GaN-on-insulator quantum well FETs with regrown ohmic contacts", IEEE Electron Device Lett., vol. 33, No. 5, pp. 661-663, May 2012.

Moram, M. A. et al, "X-ray diffraction of III-nitrides", Rep. Prog. Phys., vol. 72, No. 3, pp. 036502, Dec. 2008.

Nomoto, K., et al, "1.7-kV and 0.55-m Omega dot cm 2 GaN p-n diodes on bulk GaN substrates with avalanche capability", IEEE Electron Device Lett., vol. 37, No. 2, pp. 161-164, Feb. 2016.

Pan, C.C. et al, "High optical power and low efficiency droop blue light-emitting diodes using compositionally step-graded InGaN barrier", Electron. Lett., vol. 51, No. 15, pp. 1187-1189, Jul. 2015.

Qi, M., et al, "Strained GaN quantum-well FETs on single crystal bulk AlN substrates", Appl. Phys. Lett., vol. 110, No. 6, pp. 063501, Feb. 2017.

Rajabi, S., et al, "A novel double field-plate power high electron mobility transistor based on AlGaN/GaN for performance improvement", Proc. IEEE ICSCCN, pp. 272-276, Jul. 2011.

Reddy P. et al,"Schottky contact formation on polar and nonpolar AlN", J. Appl. Phys., vol. 116, No. 19, pp. 194503, Nov. 2014.

Reeves, G. K., et al. "Obtaining the specific contact resistance from transmission line model measurements." IEEE Electron device letters 3.5 (1982): 111-113.

Wang, T.Y., et al, "Defect annihilation mechanism of AlN buffer structures with alternating high and low V/III ratios grown by MOCVD", CrystEngComm, vol. 18, No. 47, pp. 5152-5159, Nov. 2016.

Wu, Y.-F., et al, "Very-high power density AlGaN/GaN HEMTs", IEEE Trans. Electron Devices, vol. 48, No. 3, pp. 586-590, Mar. 2001.

Xi, Y. A., et al, "Very high quality AlN grown on (0001) sapphire by metal-organic vapor phase epitaxy", Appl. Phys. Lett., vol. 89, No. 10, pp. 103106, Sep. 2006.

* cited by examiner

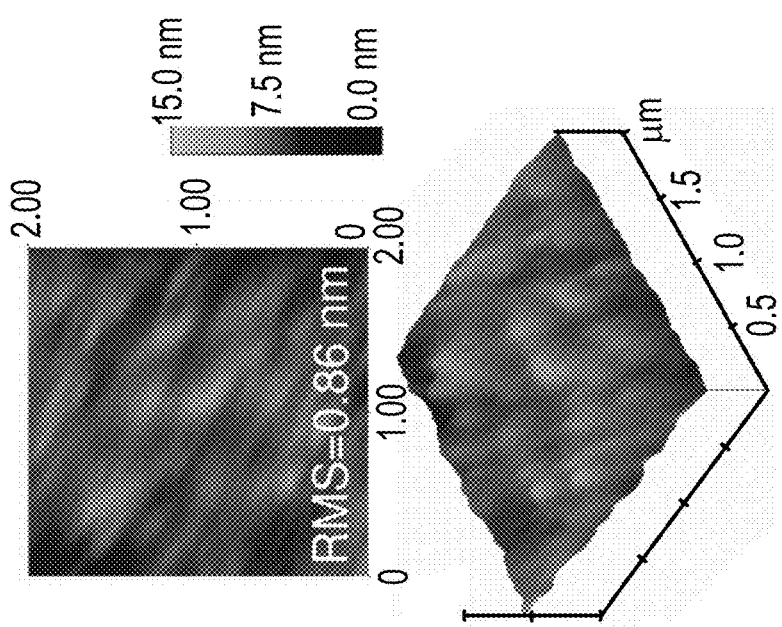
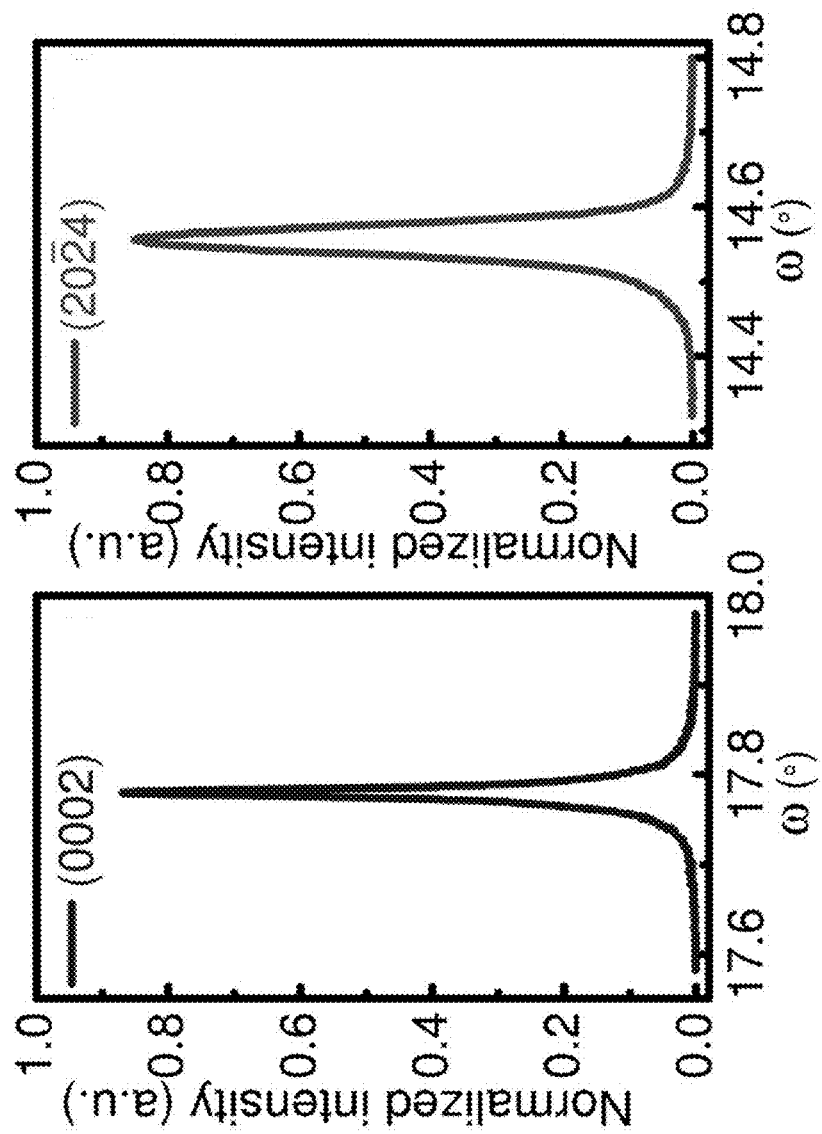

HIGH-VOLTAGE ALUMINUM NITRIDE (AlN) SCHOTTKY-BARRIER DIODES

CROSS-REFERENCE TO RELATED APPLICATIONS

This application claims priority from and benefit of the U.S. Provisional Patent Application No. 62/582,600 filed on Nov. 7, 2017, the disclosure of which is incorporated by reference herein.

TECHNICAL FIELD

This invention relates to AlN Schottky barrier diodes and, in particular, to AlN Schottky barrier diodes formed on sapphire substrates using metal organic chemical vapor deposition and characterized with a kV-class breakdown voltage.

RELATED ART

Wurtzite phase AlN has the largest bandgap of 6.2 eV among the wide bandgap semiconductor family including SiC (3.3 eV), GaN (3.4 eV), $\beta$-$Ga_2O_3$ (4.8 eV) and diamond (5.5 eV), all of which are attractive materials for use in various optoelectronic and electronic applications. Currently, AlN is primarily used for formation of so-called templates on which the devices are grown. For the active portions of such devices, however, the III-nitride counterparts of AlN (such as, i.e., In(Ga)N and Ga(Al)N) are conventionally utilized. For example, related art demonstrated ultraviolet (UV) light emitting diodes (LEDs) and various field-effect transistors (FETs) built with the use of AlN-based templates (which include, for instance, a substrate made of sapphire that carries a thin layer of AlN).

A typical, commonly-used structure of the InGaN-based LEDs utilizes a very thin (~10 nm) AlN buffer layer, on top of which a thick layer of a different material is additionally grown. Such AlN buffer layer is conventionally recognized in the art to be of no practical use for other, power electronic devices at least for the following reasons: 1) lack of high doping, 2) persisting defects in material structure, and 3) adverse surface states. In fact, there appears to be a trend of utilizing a GaN buffer layer (instead of the AlN buffer layer) for fabrication of blue-green LEDs and AlGaN or AlGaN/AlN supperlattice buffer layer(s) for fabrication of UV LEDs. And yet—which seems to avoid the recognition in the art—if the active region of electronic (as opposed to optoelectronic) devices formed on AlN-based templates utilized AlN material itself, the resulting AlN devices would have the potential to outperform current GaN-based power devices. In favor of such possibility, AlN boasts larger critical electric field (12 MV/cm) and larger thermal conductivity (340 W/mK) than those of GaN.

The related-art experience with the use of AlN material for formation of power electronic devices—as compared with that for formation of LED devices, for example—deserves a special mentioning. It is well recognized, for example, that the implementation of high quality AlN usually requires a) a very high growth temperature (1200 deg C. or higher, which remains practically challenging), and solutions to the problems b) of successful high-level doping of AlN (at concentrations exceeding those acceptable for LED devices by at least three orders of magnitude), c) high activation energy of a doping material in AlN host, and d) matching of lattice constants and thermal expansion coefficients between AlN and the substrate material (for example, sapphire), to name just a few. Without solving these problems—and, to the best knowledge, solutions that may be available have not been publicly discussed—the prevailing point of view in the related art to-date is that AlN is not a good candidate material for fabrication of power electronic devices.

While Reddy et al. ("Schottky contact formation on polar and nonpolar AlN," J. Appl. Phys., vol. 116, no. 19, p. 194503, November 2014, doi: 10.1063/1.4901954), for example, investigated the Schottky barrier heights between AlN and different metals, and while Irokawa et al. ("Schottky Barrier Diodes on AlN Free-Standing Substrates," Jpn. J. Appl. Phys., vol. 51, no. 4R, p. 040206, March 2012, doi: 10.1143/JJAP.51.040206) made an attempt to construct a AlN-based lateral Schottky barrier diode (a lateral SBD) directly on unintentionally doped (UID) AlN substrate grown by physical vapor transport (PVT), it remains known and recognized in the art that—due to the not-overcome-to-date multiple problems with the material growth—the fabrication of AlN power electronic devices remain extremely challenging and not worth the costs. This common knowledge and experience continues to deter the efforts to realize the AlN-based power electronics in a cost-efficient fashion. In the implementation of the AlN-based electronic devices by Irokawa, for example, the n-type conductivity was thought to originate from unintentional oxygen impurities or nitrogen vacancies. (Irokawa's devices exhibited a turn-on voltage of 2.6 V, an ideality factor of 12, and a rather low breakdown voltage below 50 V.) In different circumstances, while Kinoshita et al. ("Fabrication of vertical Schottky barrier diodes on n-type freestanding AlN substrates grown by hydride vapor phase epitaxy," Appl. Phys. Express, vol. 8, no. 6, p. 061003, May 2015, doi: 10.7567/APEX.8.061003) demonstrated a vertical AlN SBD on 250-µm-thick n-AlN substrate by hydride phase vapor epitaxy (HVPE) after removing the insulating seed substrate, the process of removal of the insulating seed substrate caused a significant amount of surface damages, which led to lower device performances compared with theoretical results. (In this case, the AlN SBD had a turn-on voltage of 2.2 V, an ideality factor of 8, and a breakdown voltage of 550-770 V.) (The term "ideality factor" is used herein to refer, in connection with a diode, to a measure of how closely the performance of the diode follows the ideal diode equation of $I=I_0 [\exp(qV/nkT)-1]$, where $I_0$ is a constant, q is the electron charge, V is the voltage, n is ideality factor, k is Boltzmann constant and T is temperature. Generally, the larger the ideality factor, the worse the device is performing.)

SUMMARY

Embodiments of the invention provide a method for fabrication of a Schottky Barrier Diode (SBD) in AlN. The method includes the steps of (a) growing, in a gas phase in a reactor chamber, a first layer of AlN on an AlN material base, the material base being disposed on a substrate; (b) after interrupting said growing the first layer, introducing into the reactor chamber a source gas that contains dopant material to incorporate said doping material into the first layer to form a first doped layer of AlN; (c) growing a second layer of AlN on top of the first doped layer of AlN; (d) after interrupting said growing the second layer, introducing into the reactor chamber the source gas to incorporate said doping material into the second layer to from a second doped layer of AlN; and, (e) if required, repeating at least (a) and (b) a predetermined number of time to produce an aggregate doped layer of AlN that has a pre-determined thickness.

Embodiments further provide a Schottky Barrier Diode (SBD) formed on a non-AlN substrate. The diode includes a multilayer stack of AlN materials carried by the non-AlN-substrate, the stack containing (i) an AlN buffer layer disposed directly onto the substrate; (ii) a first layer of AlN carried by the AlN buffer layer, said first layer having a first net doping concentration and a first thickness; and (iii) a second layer of AlN disposed directly onto the first layer. Here, the second layer has a second net doping concentration and a second thickness, the second net doping concentration being at least three orders of magnitude higher than the first net doping concentration. The diode further includes a capping layer covering the second layer and configured to prevent an oxidation of a material of the multilayer stack.

BRIEF DESCRIPTION OF THE DRAWINGS

The invention will be more fully understood by referring to the following Detailed Description in conjunction with the generally not-to scale Drawings, of which:

FIGS. 2A, 2B, 2C, and 2D present a rocking curve of (0002) plane for AlN SBD (FIG. 2A) and of (20-24) plane for AlN SBDs (FIG. 2B) obtained with high-resolution X-ray diffraction (HRXRD), as well as atomic force microscopy (AFM) images in two dimensions (FIG. 2C) and three dimensions (FIG. 2D).

Figure 1A:
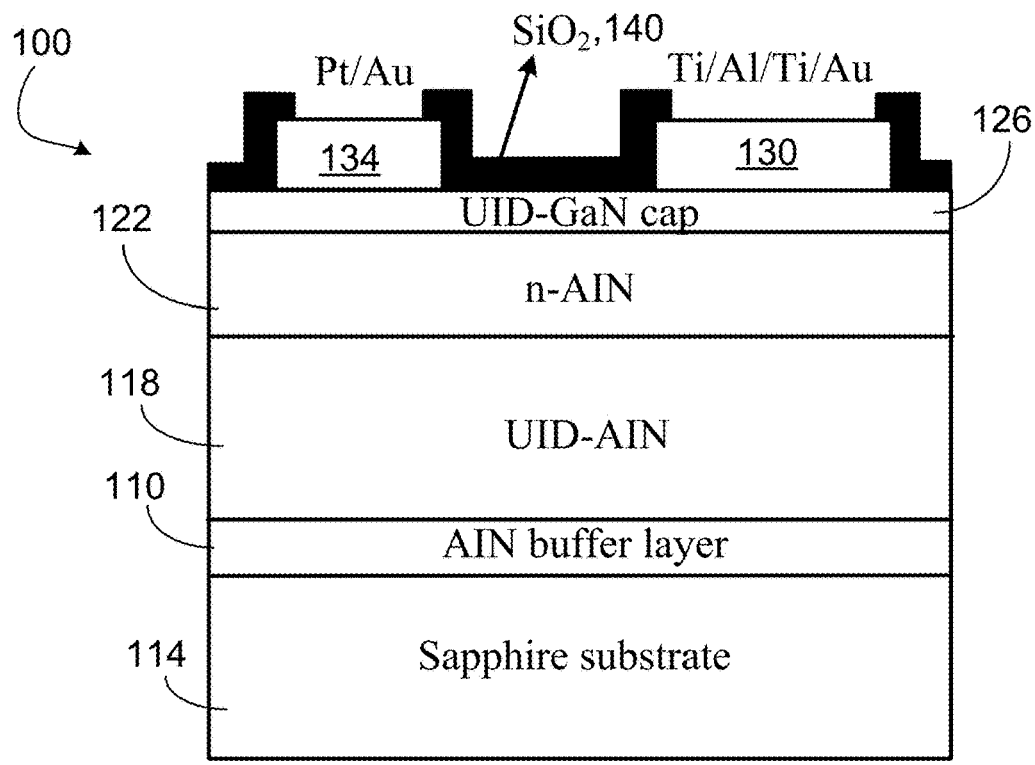
FIGS. 1A, 1B schematically illustrates related embodiments of the invention configured as an AlN SBD on a sapphire substrate.

The sizes and relative scales of elements in Drawings may be set to be different from actual size and scales to appropriately facilitate simplicity, clarity, and understanding of the Drawings. For the same reason, not all elements present in one Drawing may necessarily be shown and/or labeled in another.

DETAILED DESCRIPTION

Notwithstanding the initial attempts to realize the AlN-based electronics, and as is well-recognized in related art, bulk AlN substrates remain too expensive for practical use, while highly doped n-AlN substrates (required for such realization) are not readily available, rendering both lateral and vertical AlN SBDs on AlN substrates not commercially attractive and/or research-friendly.

The implementations of the present invention provided in a first demonstration of 1-kV-class AlN Schottky barrier diodes on sapphire substrates, resulting from metal organic chemical vapor deposition (MOCVD). The structure of the implemented device employs a combination of a thin n-AlN epilayer (configured as the device active region) on a thick resistive AlN underlayer (configured as the electrical insulator), such combination disposed on a sapphire substrate carrying a thin AlN buffer layer. This work presents a cost-effective route to high performance AlN based Schottky barrier diodes for high power, high voltage and high temperature applications. (The cost of a 2 inch diameter sapphire substrate is about 250× lower than the cost of a similarly dimensioned AlN substrate.)

The limitations of the related art, preventing the formation of power electronic devices—and, in particular, of either lateral or vertical Schottky Barrier Diodes (SBDs)—in AlN material include prohibitively-high cost of bulk AlN substrates and lack of high quality, highly-doped AlN substrates. To this end, several material-growth- and device-fabrication-related problems remain. For example, as a result of the lattice mismatch and difference in thermal expansion coefficients between that of AlN and sapphire, a thick AlN layer deposited on a sapphire substrates tends to crack, leading to the realization that multiple parameters of material growth parameters—such as pressure, gas flow rate, and temperature, to name just a few, need to be judiciously and contemporaneously optimized.

Furthermore, achieving the high level of doping of the AlN remains quite problematic in the art. For one thing, there is a solubility problem: after a certain level of Si concentration in AlN has been exceeded, Si atoms are not being incorporated into the AlN crystal lattice anymore. For another, high doping levels also lead to wafer cracks, which detrimentally affects power electronics. Moreover, there remains a recognized problem caused by the high activation energy of dopant Si in AlN host. Because of the ultra-wide bandgap of AlN (~6 eV), only about 0.1% or less of the amount of Si dopant material provides electrons for the device operation (thereby leading to low levels of doping, not suitable for power electronic device operation). Because of the fact of high activation energy of dopant Si in AlN host and the requirement of high doping levels, the prevailing point of view in the related art to-date is that AlN is not a good candidate material for fabrication of power electronic device.

These limitations are overcome in the embodiments of the present invention as a result of expanding the material template, conventionally used by related art for fabrication of LED-type devices, from (i) a combination of a non-AlN material substrate and an ultrathin (~30 nm) AlN buffer layer, disposed on such substrate, to (ii) that which carries, in addition, a multilayer AlN-based stack containing an intentionally-doped AlN-active layer separated from the conventional material template by a thick AlN-based insulator layer. Such structural solution for the expanded material template facilitated a successful implementation of doping, of the AlN active layer that exceeded those demonstrated to-date by at least 3 orders of magnitude. In particular, the intentional doping of an AlN layer up to levels of $10^{17}$ cm$^{-3}$ or even $10^{19}$ cm$^{-3}$ (exceeding that of about $10^{14}$ cm$^{-3}$ in typical AlN-based templates used for fabrication of LED-type devices).

The judiciously implemented formatting of material growth process—especially when a flow of SiH$_4$ (a source for Si) was used in the reactor, in combination with pulsed growth methodology for better Si incorporation into the host (AlN) material resulted in a solution in which the growth of AlN was alternated with incorporation of the dopant (such as Si). In particular, the growth of AlN was interrupted according to a predetermined schedule while SiH$_4$ was flown into the reactor, followed by the repeated combination of the same steps (of growing another layer of AlN and supplying SiH$_4$ for Si-doping of the just-grown AlN).

As a consequence of choosing such complex structuring combined, high levels of doping were not only facilitated but realized, leading to AlN SBDs (in a multilayer stack of AlN epilayers disposed on a sapphire substrate) that, at room temperature, demonstrated outstanding performances with a low turn-on voltage of 1.2 V, a high on/off ratio of ~$10^5$, a low ideality factor of 5.5, a high breakdown voltage of over 1 kV, and a low reverse leakage current below 1 nA. The resulting devices also exhibited excellent thermal stability over 500 K, owing to the ultra-wide bandgap of AlN.

In one implementation, the AlN SBD epilayer was grown by MOCVD on a single side polished (SSP) (0001) sapphire substrate (with 0.2° off-cut angle, in one example). (For the purposes of the MOCVD fabrication, the trimethylaluminum (TMAl) and ammonia (NH$_3$), respectively, were used as the source of Al and N, while SiH$_4$ was used as the precursor for n-type dopant Si, and while the carrier gas was hydrogen.) The embodiment 100 of the device structure schematically illustrated in FIG. 1A includes an AlN buffer layer 110 on a sapphire substrate 114, and an approximately 1-μm-thick resistive UID AlN underlayer (UL) 118, a 300 nm thick Si-doped n-AlN layer 122, and a 2 nm UID GaN capping layer 126, disposed one on top of the other and carried by the layer 110. (In related embodiments, the thickness of the layer 118 may be approximately between 0.5 micron and 2.5 microns; the thickness of the layer 122 may be between about 100 nm and 600 nm; and the thickness of the capping layer 126 may be between about 1 nm and 5 nm.) The thin UID GaN capping layer 126 was used to prevent the oxidation of AlN epilayers underneath (such oxidation might degrade the device performances). Here, the implementation of an idea of the invention took advantage of the fact that GaN and AlN have the same hexagonal crystal structure (thereby not compromising the quality of the material growth with the use of the same MOCVD chamber) and the fact that GaN is not easily oxidized (while, at the same time, the GaN that has been oxidized can be easily removed during the device fabrication with the use of acid.) The oxidation-preventing layer has to be grown at the same time as the AlN is being grown in the same chamber, which makes the choice of the GaN material preferred (for example, the alternative material—AlGaN—when used is also subject to easy oxidation due to the presence of Al. Another possible alternative, InGaN, has larger lattice mismatch with AlN and is not very stable at high temperature).

The crystal quality of the MOCVD AlN sample was characterized by high-resolution X-ray diffraction (HRXRD) with the use of PANalytical X'Pert Pro materials research X-ray diffractometer (MRD) system with Cu Kα radiations. A hybrid monochromator and a triple axis module were used for the incident and diffracted beam optics, respectively. FIGS. 2A, 2B illustrate the (0002) symmetric and (20$\bar{2}$4) asymmetric plane rocking curves (RCs) for the AlN sample. The full width at half maximum (FWHM) of (0002) RC is 46.8 arc sec and FWHM of (20$\bar{2}$4) RC is 159.1 arc sec, which are among the lowest FWHM reported on MOCVD grown AlN epilayers on sapphire substrate, causing, as a result, a much smaller defect density leading to the improvement of the device performance by reducing leakage pathways and the possibility of reduced breakdown voltage. The dislocation density of the sample was estimated to be ~$10^8$ cm$^{-2}$ using the equation of $$D = \frac{\beta_{(002)}^2}{9\vec{b}_1^2} + \frac{\beta_{(102)}^2}{9\vec{b}_2^2},$$

where β is FWHM and $\vec{b}$ is the Burgers vector. The surface morphology of the AlN sample was examined with the use of Bruker's Dimension atomic force microscopy (AFM). The root-mean-square (RMS) roughness of 2×2 μm$^2$ scanning area of the samples was measured to be 0.86 nm. The HRXRD and AFM results confirmed that AlN epilayers with low defect density and good surface morphology were obtained on sapphire substrates.

The as-grown sample was then cleaned in acetone and isopropyl alcohol under ultrasonic and dipped in hydrochloric acid (HCl:H$_2$O=1:2) before the deposition of metal layers. The AlN SBD devices were fabricated using conventional optical photolithography and lift-off processes. For the ohmic contacts, Ti/Al/Ti/Au (20 nm/100 nm/20 nm/50 nm) metal stacks (shown as 130 in FIG. 1A) were deposited by electron beam deposition, followed by thermal annealing of the structure at 1000° C. in nitrogen for 30 seconds using rapid thermal annealing (RTA). The circularly-shaped ohmic contact had a diameter of about 400 μm. For the Schottky contacts, on the other hand, Pt/Au (30 nm/120 nm) metal stacks (shown in FIG. 1A as 134) were deposited by electron beam evaporation. For comparison, both circular (diameter of 100 μm) and square Schottky contacts (side length of 100 μm) were fabricated. The distance between the ohmic contact and Schottky contact was chosen to be 200 μm (but is not limited to this particular value in related embodiments). A 200 nm SiO$_2$ passivation layer 140 was then deposited on the devices using plasma-enhanced chemical vapor deposition (PECVD) at 350° C. and 1000 mTorr with an RF power of 20 W. Finally, the contact vias were opened with fluorine-based reactive ion etching (RIE). No field plate or edge termination were implemented in the embodiment 100 of the devices.

Figure 3B:
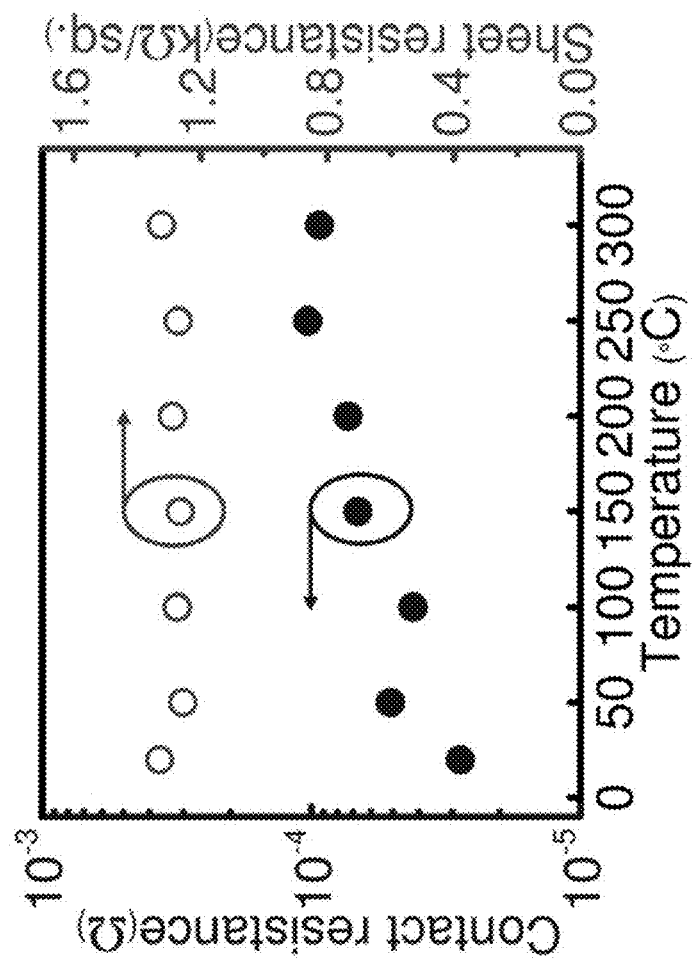
FIG. 3B: Contact resistance and sheet resistance as a function of temperature.
Figure 3A:
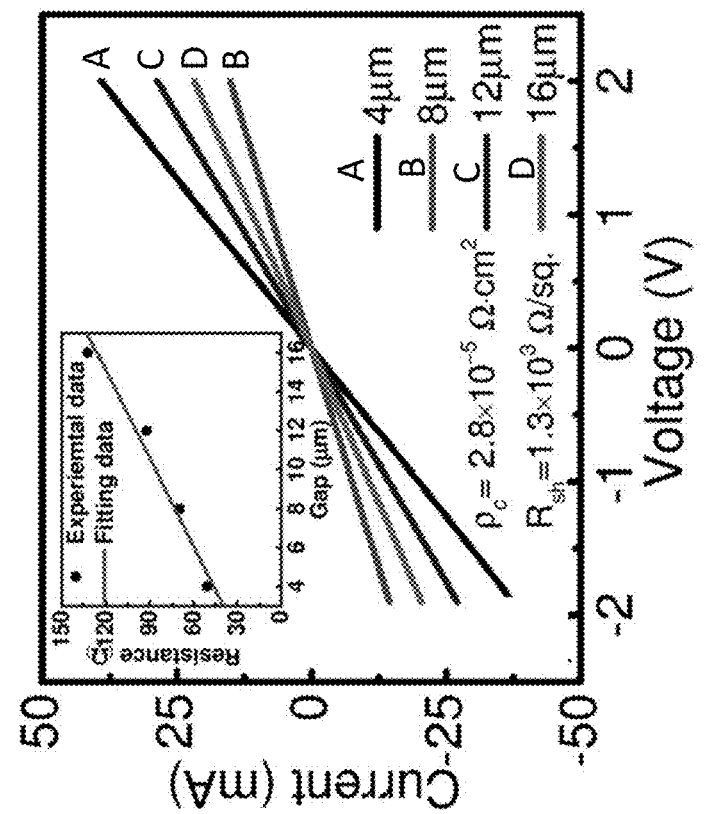
FIG. 3A illustrates I-V characteristics of the ohmic contact, obtained at room temperature (RT) with a transmission-line method (TLM). The inset shows the resistance versus gap of the TLM pads. A linear fitting was performed to extract the contact resistance and sheet resistance.

The ohmic contacts 130 of various embodiments 100 were assessed with transmission line method (TLM) (see, for example, G. K. Reeves and H. B. Harrison, IEEE Electron Device Letter 3, 111 (1982)) from room temperature (RT) to 300° C. FIG. 3A illustrates the TLM current-voltage (I-V) curves at RT. The contacts showed good ohmic behavior with a contact resistance of $2.8 \times 10^{-5}$ Ω·cm$^2$ and a sheet resistance of $1.3 \times 10^3$ Ω/sq., shown in FIG. 3B. The ohmic contacts also exhibited excellent thermal stability over the measured temperature range (RT to 300° C.). The contact resistance slightly increased with the increasing temperature, which behavior was not necessarily attributed to the intrinsic nature of the ohmic contact of AlN (because stressful probes could destroy the integrity of metal stacks and thus resulted in somehow a degradation of ohmic contacts), but rather to a physical mechanism that requires further investigations.

Figures 4A, 4B:
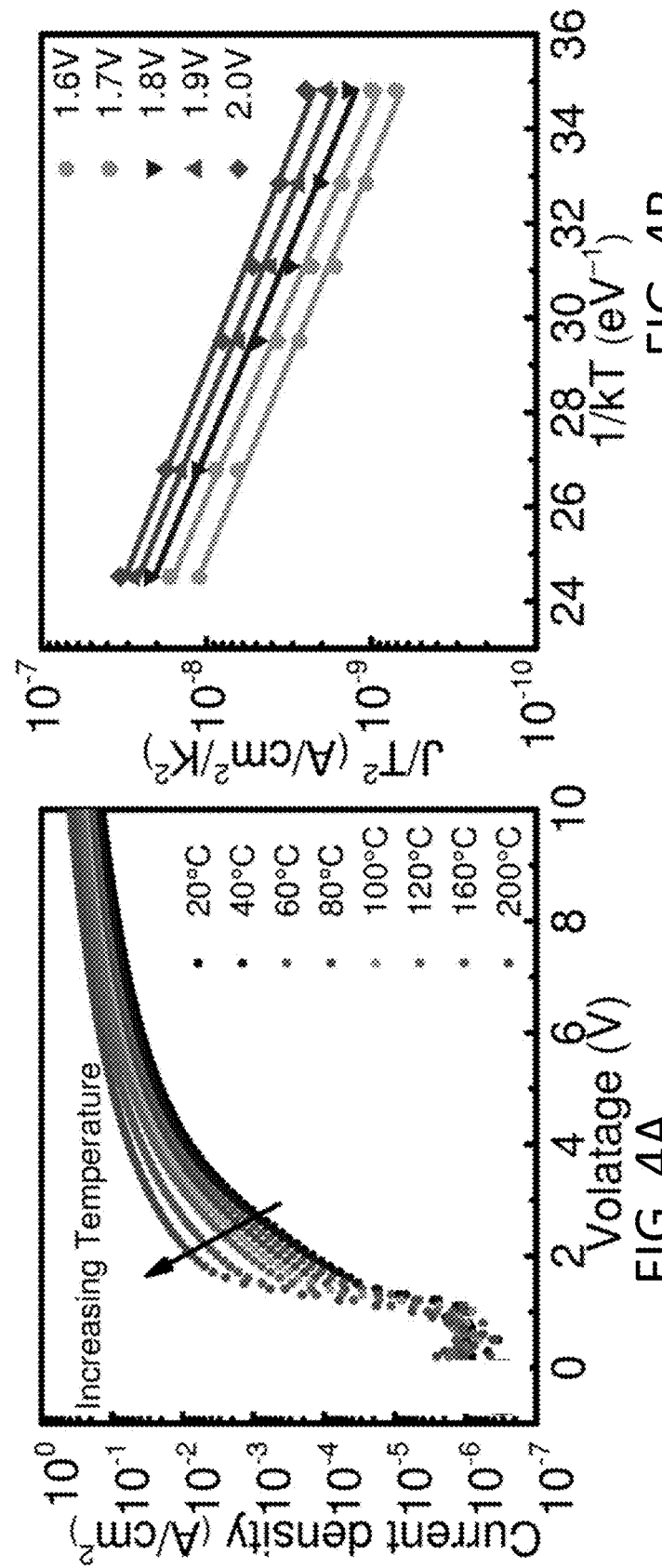
FIG. 4A shows forward I-V characteristics of the circular AlN SBD from 20° C. to 200° C.
FIG. 4B: The Richardson plot from 1.6V to 2.0 V in a step of 0.1 V.

The electrical measurements were conducted on a probe station equipped with a thermal chuck. The I-V characteristics at forward bias and reverse bias were measured using the Keithley 2410 sourcemeter. FIG. 4A shows the temperature-dependent forward I-V characteristics of the circular AlN SBDs. The lower current detection limit of the setup was 1 nA, and the measured off current densities were as low as ~$10^{-6}$ A/cm$^2$ at all considered temperatures. A high on/off ratio of about $10^5$ was obtained, which is comparable to that of AlN SBDs on AlN substrates. The turn-on voltage of the devices was 1.2 V (1.1 V for square SBDs), smaller than previous reported values discussed by Irokawa and Kinoshita. The constant slope of a Richardson plot (J/T$^2$ vs. 1/kT, presented in FIG. 4B, where J is the current density, k is the Boltzmann constant, and T is the temperature) indicated that the forward current of the devices was limited by thermionic emission.

Figures 5A, 5B:
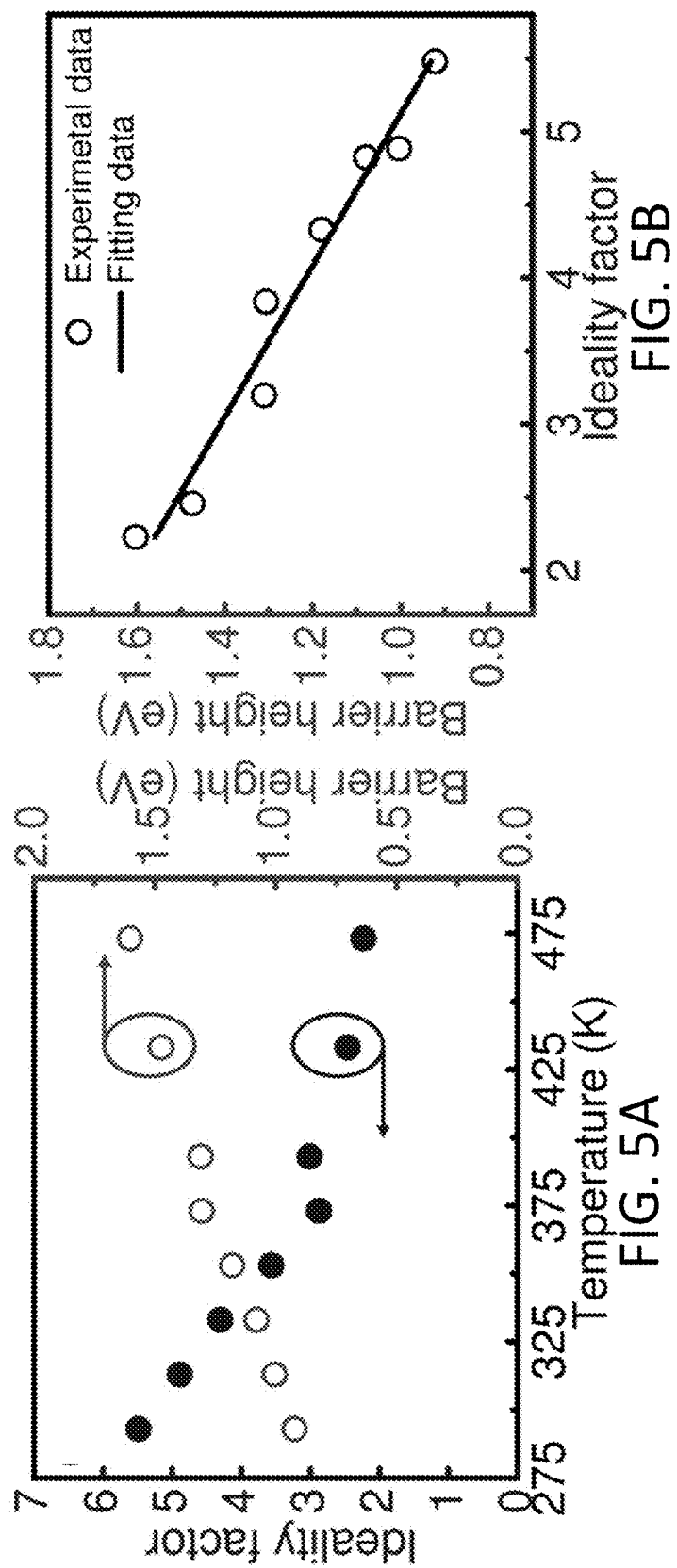
FIG. 5A represents the "ideality" factor and a barrier height as a function of temperature, measured for the embodiment on FIG. 1.
FIG. 5B demonstrates the barrier height vs. the ideality factor.

The general diode equations for thermionic emission can be expressed as $$J = J_0 \exp(q(V-IR_S)/nkT - 1) \tag{1}$$

$$J_0 = A^* T^2 \exp(-\Phi_B/kT) \tag{2}$$

where $J_0$ is the saturation current density, $R_S$ is the series resistance, n is the ideality factor, $A^*$ is the Richardson constant and $\Phi_B$ is the barrier height. The Richardson constant was calculated to be 48 A/(cm$^2$K$^2$) using the effective electron mass of 0.5 $m_0$. Based on Eqs. (1) and (2), ideality factor and barrier height of the AlN SBDs were assessed as a function of temperature (see plots of FIG. 5A). The ideality factor decreased from 5.5 to 2.2 while the barrier height increased from 0.9 eV to 1.6 eV from 20° C. to 200° C. The temperature dependence of the ideality factor was attributed to the lateral inhomogeneity of the Schottky barrier interface. The RT ideality factors (n=5.5 and 5.3 for circular and square SBDs, respectively) obtained for implementations of the present invention were discovered to be 2 to 3 times smaller than previously demonstrated ideality factors, possibly due to improved material quality and metal/semiconductor interface. A well-known linear correlation between the barrier height and the ideality factor was also observed due to the non-uniform Schottky interface. FIG. 5B presents a plot expressing the correlation between the ideality factor and the barrier height based on empirical data collected for the range of temperatures from about 20° C. to about 200° C.

The capacitance-voltage (C-V) characteristics of embodiment(s) were assessed with the Keithley 4200-SCS parameter analyzer. The reverse breakdown measurements were performed in insulating Fluorinert liquid FC-70 at RT.

Figures 6A, 6B:
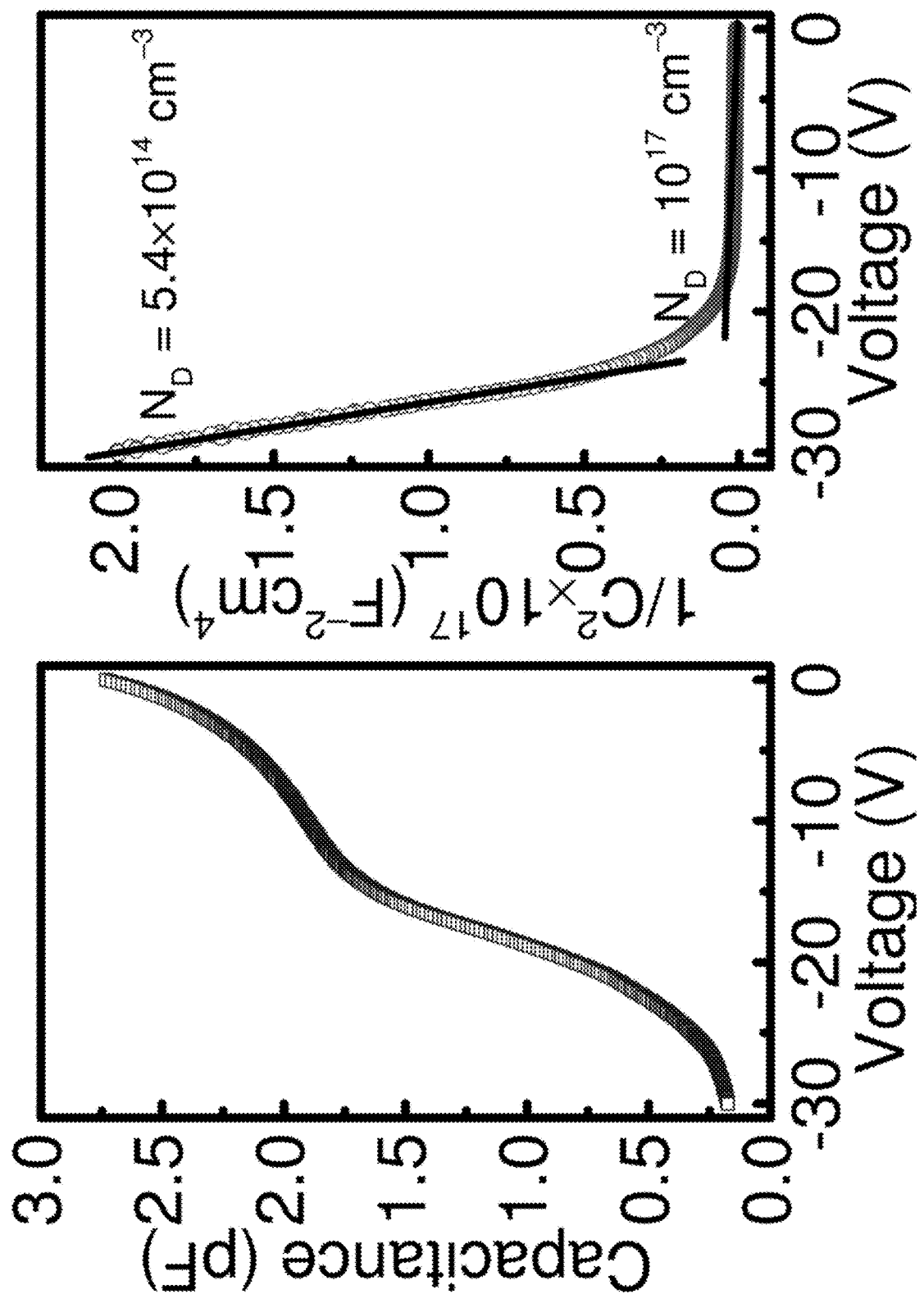
FIGS. 6A and 6B present, respectively, C-V and $1/C^2$ vs. V characteristics for AlN SBDs at 1 MHz. The doping concentrations of the n-AlN layer and resistive UID AlN UL may be determined from the slopes in $1/C^2$ vs. V.

FIG. 6A illustrates C-V characteristics of the AlN SBDs at a frequency of 1 MHz. The net doping concentration $N_D$ can be obtained using $$1/C^2 = \frac{2}{q\varepsilon_0\varepsilon_r N_D}(V_{bi} - V - kT/q) \tag{3}$$

$$d(1/C^2)/dV = -\frac{2}{q\varepsilon_0\varepsilon_r N_D} \tag{4}$$

where $V_{bi}$ is the built-in voltage, $\varepsilon_0$ is permittivity of the vacuum, and $\varepsilon_r$ is relative permittivity of AlN. After plotting 1/C$^2$ vs. V, two slopes were observed, which corresponded to the net doping concentrations in n-AlN layer ($N_D$=10$^{17}$ cm$^{-3}$) and resistive UID AlN UL ($N_D$=5.4×10$^{14}$ cm$^{-3}$), respectively. This result indicated that the UID AlN UL layer 118 was much more resistive than the n-AlN layer 122 of the structure 100 of FIG. 1. The high resistivity of UID AlN UL 118 was also confirmed by the contactless sheet resistance measurement (performed with the use of Model LEI-88,) exceeding the apparatus upper limit of 10$^4$ Ω/sq). The Silvaco ATLAS simulation showed the majority of current paths were confined in the thin n-AlN layer 122 due to the high resistivity of UID AlN UL 118. The growth of a thick resistive (and substantially, electrically-insulating) UID AlN UL 118 proved to not only improve the material quality of n-AlN epilayer, but also reduce the current leakage and increase the breakdown voltage, thereby solving at least some of the problems faced by related art. Notably, in formation of the UL layer, the trade-off must be observed when deciding on the thickness of this layer (with excessive thickness causing the cracking of the wafer and degradation of the material quality. In one embodiment, the thickness of the UL layer was pre-determined to be within the range from about 1 micron to about 3 microns. The UL layer is expected to be much more resistive than the active region n-AlN layer to prevent leakage. In related embodiments, the UL layer can be doped with carbon or iron to further increase its resistivity.

Figures 7A, 7B:
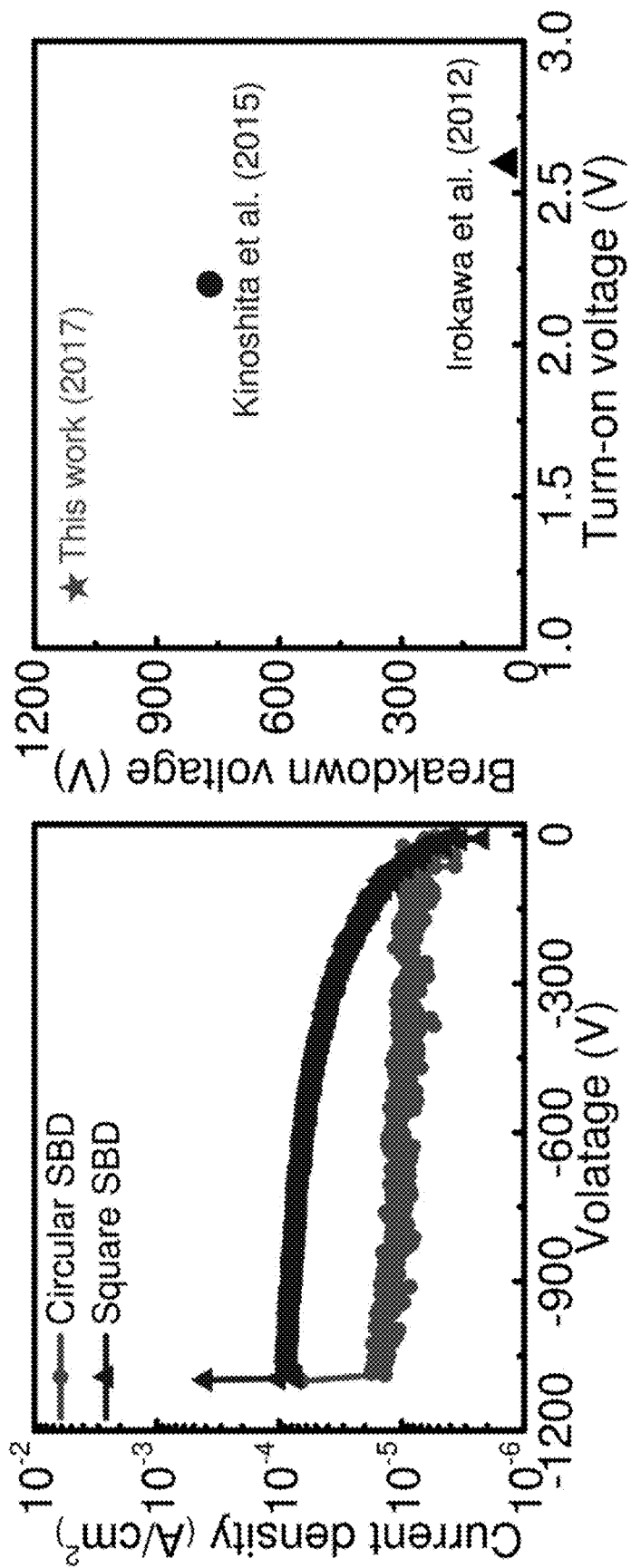
FIG. 7A shows reverse I-V characteristics of circular and square AlN SBDs.
FIG. 7B: Comparison of the breakdown and turn-on voltages of AlN SBDs of related art.

The plots of FIG. 7A represent reverse I-V characteristics of the circular and square AlN SBDs. Both devices exhibited breakdown voltages over 1 kV, which are much higher than previous reports (~700 V). The catastrophic damages of the AlN SBDs occurred at the edge of Schottky contacts due to edge electric field crowding. The breakdown was therefore not intrinsically limited by the critical electric field of AlN. Improvement in the breakdown capability of the devices can be further expected by employing field plate and/or edge termination. In addition, improving the material quality of n-AlN, increasing the resistivity of the UID AlN UL by Fe or C doping and optimizing the passivation strategies can also help to increase the breakdown voltage of the devices.

It is appreciated, therefore, that the novelty of the proposed system and method manifests in realizing high-voltage AlN SBDs on cheap, cost-effective to manufacture substrates. The related art has not realized, to date, the deposition of the AlN material on the sapphire substrate with quality sufficient to produce high performance devices. Additionally, as related to AlN power electronics, the current invention addressed the persistent problem of the related art in forming a good and thermally stable ohmic contact (the problem cause by the ultra-wide bandgap of AlN, ~6 eV), at least in part by judiciously addressing the annealing conditions are critical.

The embodiments of the present invention demonstrated, for the first time, an SOI-like structured lateral AlN SBDs, grown and fabricated on sapphire substrates by MOCVD. At forward bias, the AlN SBDs exhibit good rectifying behavior with a turn-on voltage of 1.2 V, an on/off ratio of ~10$^5$, and an ideality factor of 5.5 at RT. At reverse bias, the devices demonstrated over 1 kV breakdown voltage and below 1 nA leakage current. Material growth and device structure optimizations are expected to further increase the breakdown voltage. In addition, the devices show excellent thermal stability over 500 K. These results demonstrated high potential of AlN SBDs on sapphire substrate for high power, high voltage and high temperature applications. In addition to implementation of multistack AlN structure(s) according to the novel stop-and-go, iterative deposition methodology described above, the substantially electrically-insulating UID AlN layer was configured to confine the current in the n-AlN device active region to reduce detrimental leakage current, thereby obviating a persistent problem of related art and improving the rectifying behavior ("on/off ratio") as well as the breakdown voltage of the fabricated device.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

As a non-limiting example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). As another example, the use of the term "substantially flat" in reference to the specified surface implies that such surface may possess a degree of non-flatness and/or roughness that is sized and expressed as commonly understood by a skilled artisan in the specific situation at hand.

Other specific examples of the meaning of the terms "substantially", "about", and/or "approximately" as applied to different practical situations may have been provided elsewhere in this disclosure. The use of these term in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

Implementation of or operation of an embodiment of the system of the invention may require the use of electronic circuitry (for example, a computer processor) controlled by instructions stored in a memory, to perform specific data collection/processing and calculation steps as disclosed above. The memory may be random access memory (RAM), read-only memory (ROM), flash memory or any other memory, or combination thereof, suitable for storing control software or other instructions and data. Those skilled in the art should would readily appreciate that instructions or programs defining the operation of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks.

The invention as recited in claims appended to this disclosure is intended to be assessed in light of the disclosure as a whole. Various changes in the details, steps and components that have been described may be made by those skilled in the art within the principles and scope of the invention.

Figure 1B:
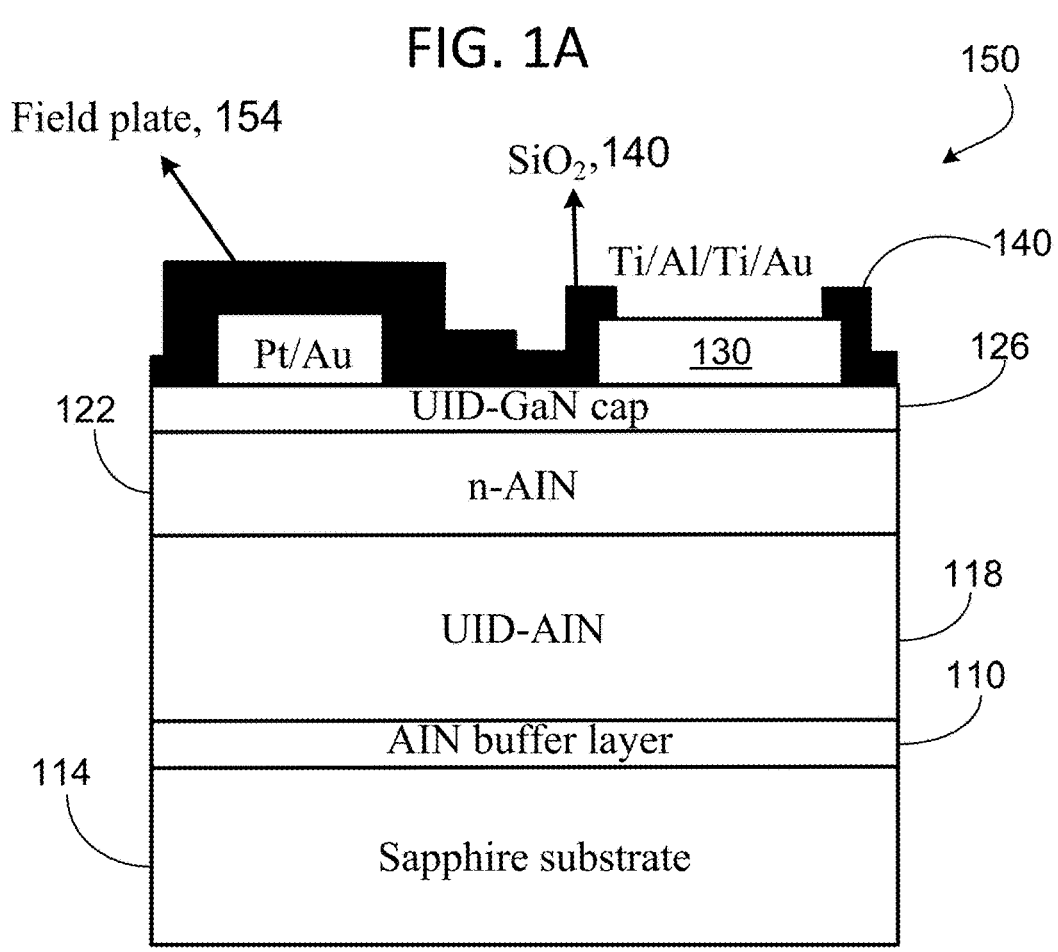

For example, and in reference to FIG. 1B, the breakdown voltage of a device configured according to an embodiment of the invention could be improved even further in a related embodiment 150 that employs a field plate 154 (preferably made from a metallic material) and/or edge termination technologies to reduce electric field at the edge(s) of the metal contacts, as well as with the optimization of the overall device structure.

The methodology discussed in this disclosure is generally applicable to enhancing the operation of substantially any electronic device to achieve the goal of increasing the value of the breakdown voltage.

The invention claimed is:

1. A Schottky Barrier Diode (SBD), comprising:
   (i) a non-AlN substrate;
   (ii) a multilayer stack of AlN materials carried by the non-AlN-substrate, the stack containing:
      an AlN buffer layer disposed directly onto the substrate;
      a first layer of AlN carried by the AlN buffer layer, said first layer having a first net doping concentration and a first thickness; and
      a second layer of AlN disposed directly onto the first layer, said second layer having a second net doping concentration and a second thickness, the second net doping concentration being at least three orders of magnitude higher than the first net doping concentration; and
   (iii) a capping layer covering the second layer and configured to prevent an oxidation of a material of the multilayer stack.

2. The SBD according to claim 1, wherein the capping layer includes GaN.

3. The SBD according to claim 1, further comprising first and second electrically-conductive layers disposed on top of the capping layer and spatially separated from one another by a gap configured as an electrical insulating section.

4. The SBD according to claim 3, wherein said gap is filled with a dielectric material.

5. The SBD according to claim 1, wherein the SBD is devoid of at least one of a field plate and an edge termination.

6. The SBD according to claim 1, further comprising at least one of a field plate and an edge termination.

7. The SBD according to claim 1, further comprising a passivation layer disposed on the capping layer to reduce adverse surface.

8. A method for fabrication of a Schottky Barrier Diode (SBD) in AlN, the method comprising:
   (a) growing, in a gas phase in a reactor chamber, a first layer of AlN on an AlN buffer layer disposed directly on a non-AlN substrate;
   (b) after interrupting said growing the first layer, introducing into the reactor chamber a source gas that contains dopant material to incorporate said doping material into the first layer to form a first doped layer of AlN having a first net doping concentration and a first thickness;
   (c) growing a second layer of AlN directly on the first doped layer of AlN;
   (d) after interrupting said growing the second layer, introducing into the reactor chamber the source gas to incorporate said doping material into the second layer to form a second doped layer of AlN having a second net doping concentration and a second thickness, the second net doping concentration being at least three orders of magnitude higher than the first net doping concentration;
   (e) repeating at least (a) and (b) a predetermined number of times to produce an aggregate doped layer of AlN that has a pre-determined thickness; and
   depositing a cap layer on top of the aggregate doped AlN layer, the cap layer configured to prevent oxidization of any of AlN layers underneath the cap layer.

9. The method according to claim 8, wherein at least one of said growing the first layer and growing the second layer includes growing a corresponding layer of AlN in absence of the dopant material in the chamber.

10. The method according to claim 8, further comprising forming the material base on the substrate, the material based including an AlN buffer layer and an AlN insulator layer, wherein a thickness of the AlN insulator layer exceeds a thickness of the aggregate doped layer of AlN.

11. The method according to claim 10, wherein said forming comprises disposing the AlN buffer layer on a sapphire substrate and the AlN insulator layer on the AlN buffer layer.

12. The method according to claim 10, wherein said forming includes growing the AlN insulator layer with a first net concentration of a chosen dopant therein, said first net concentration being at least three orders of magnitude smaller than a net concentration of said dopant in the aggregate doped layer of AlN.

13. The method according to claim 8, further comprising forming the material base on the substrate, the material based including an AlN buffer layer and an AlN insulator layer, wherein a thickness of the AlN insulator layer is at least three-fold a thickness of the aggregate doped layer of AlN.

* * * * *